United States Patent [19]

De Poorter

[11] Patent Number: 5,578,863
[45] Date of Patent: Nov. 26, 1996

[54] OPTOELECTRONIC SEMICONDUCTOR DEVICE WITH A RADIATION-EMITTING SEMICONDUCTOR DIODE, AND METHOD OF MANUFACTURING SUCH A DEVICE

[75] Inventor: Johannes A. De Poorter, Eindhoven, Netherlands

[73] Assignee: U.S. Philips Corporation, New York, N.Y.

[21] Appl. No.: 345,024

[22] Filed: Nov. 23, 1994

[30] Foreign Application Priority Data

Nov. 25, 1993 [BE] Belgium .................................. 9301296

[51] Int. Cl.$^6$ ........................ H01L 31/0232; H01L 27/15; H01L 31/12; H01L 33/00
[52] U.S. Cl. ........................... 257/433; 257/432; 257/81; 257/82
[58] Field of Search ..................................... 257/432, 433, 257/434, 81, 82, 99

[56] References Cited

U.S. PATENT DOCUMENTS

| | | | |
|---|---|---|---|
| 4,585,300 | 4/1986 | Landis et al. | 257/433 |
| 5,132,532 | 7/1992 | Watanabe | 257/433 |
| 5,414,293 | 5/1995 | Broom | 257/433 |

FOREIGN PATENT DOCUMENTS

| | | | |
|---|---|---|---|
| 0634822 | 1/1995 | European Pat. Off. | H01S 3/00 |
| 60-18076 | 9/1985 | Japan . | |
| 60-186076 | 9/1985 | Japan | H01L 33/00 |

OTHER PUBLICATIONS

"Analysis of Rapid Degradation in High–Power (AlGa) As Laser Diodes" by William J. Fritz, IEEE Journal of Quantum Electronics, vol. 26, No. 1, Jan. 1990, pp. 68–74.

Primary Examiner—Jerome Jackson
Assistant Examiner—S. V. Clark
Attorney, Agent, or Firm—Steven R. Biren

[57] ABSTRACT

An optoelectronic semiconductor device (10) with a radiation-emitting semiconductor diode (3), preferably a diode laser (3), is particularly suitable as a radiation source in optical read and write systems such as bar code readers, laser printers, and optical disc systems. The diode (3) has one or two exit surfaces for radiation (R) which are provided with coatings (4). In such a device (10) it is found that a deposit rich in carbon is formed on the coating (4) of the laser (3), with the result that the output of the diode (3) fluctuates. The deposit may be avoided in that organic impurities are avoided or a selection is carried out in that respect. However, this is cumbersome and expensive.

In a device (10) according to the invention is the diode (3) is present within an envelope (20) which is hermetically sealed off from the outer world (40), and a gaseous oxidizing compound (30) is present inside the envelope (20). It was surprisingly found that a gaseous oxidizing compound (30), preferably oxygen, counteracts or removes a deposit rich in carbon on the coating (4). Since the device (10) is hermetically sealed off from the outer world (40), degradation owing to water vapour or other aggressive gases is counteracted. The device (10) preferably contains dry and clean nitrogen to which at least approximately 0.2 vol. % oxygen (30) has been added. Particularly good results were obtained with a high-power laser (3) and a laser (3) which emits between approximately 0.6 and 0.9 μm.

13 Claims, 2 Drawing Sheets

OPTOELECTRONIC SEMICONDUCTOR DEVICE WITH A RADIATION-EMITTING SEMICONDUCTOR DIODE, AND METHOD OF MANUFACTURING SUCH A DEVICE

BACKGROUND OF THE INVENTION

The invention relates to an optoelectronic semiconductor device comprising a radiation-emitting semiconductor diode of which an exit surface for the generated radiation is provided with a coating.

Such a device is particularly suitable for use as a radiation source in, for example, an optical glass fibre system, an optical disc system, and a bar code reader. In the application first mentioned, the emission wavelength often lies between 1 and 1.5 μm, in the other applications often between 0.6 and 0.9 μm. The semiconductor material systems corresponding therewith are InGaAsP/InP and (Al)GaAs/AlGaAs or InGaP/InAlGaP, respectively.

Such a device with an (AlGa)As diode laser as the radiation-emitting diode is known from the article "Analysis of Rapid Degradation in High-Power (AlGa)As laser diodes" by W. J. Fritz published in IEEE Journal of Quantum Electronics, vol. 26, no. 1, January 1990, pp. 68–74. The device described therein comprises a diode laser tested in a dry nitrogen atmosphere or in vacuum, the mirror surfaces acting as exit surfaces for the radiation generated by the diode laser being provided with an aluminium oxide or aluminium oxide-silicon coating which is impermeable to gases. It was found that a layer rich in carbon is deposited on this coating during operation of the diode laser, which layer originates from organic impurities contained in the flux and flux cleaning liquid used during soldering of the diode laser. The diode laser is not stable in this case, i.e. the output power decreases (or fluctuates) strongly in time, for example, owing to changes in the (effective) reflection of the radiation at the mirror surface provided with the coating. Strongly improved characteristics were obtained by means of more stringent cleaning instructions and selection on the basis of the hydrocarbon content.

A disadvantage of the known device is that it is comparatively difficult to manufacture owing to the stringent cleaning requirements, and accordingly is comparatively expensive. The price of the known device is also adversely affected by the reject percentage in the selection process.

SUMMARY OF THE INVENTION

The present invention has for its object inter alia to provide an optoelectronic semiconductor device with a radiation-emitting diode having an exit surface for radiation provided with a coating, which device at least substantially does not have the disadvantages mentioned above, can be readily and cheaply manufactured, and is very stable and accordingly has a long useful life.

According to the invention, an optoelectronic device of the kind mentioned in the opening paragraph is for this purpose characterized in that the radiation-emitting semiconductor diode is situated within an envelope which is hermetically sealed from the outer world, and in that a gaseous oxidizing compound is present inside the envelope. It was a surprise to find that the presence of a gaseous oxidizing compound inside the envelope counteracts the deposition of a layer rich in carbon on the coating of laser mirrors. Laboratory research conducted by Applicant has shown that a portion of known devices manufactured in an identical manner exhibited considerably fewer fluctuations in the diode laser output than another portion. Further investigations demonstrated that those devices whose diode lasers showed the least fluctuations were leaky. Owing to the oxygen penetrating therein, the deposition of the layer rich in carbon on the coating of the laser mirror did not occur. Apparently, a gaseous oxidizing compound in combination with the heat and radiation generated during diode laser operation is capable of preventing or annihilating the deposition of said (liquid or solid) layer rich in carbon from the atmosphere onto the coating of the diode laser inside the device. Possibly, carbon or gaseous carbon-containing compounds are converted here into, for example, carbon diode which is gaseous, or into other gaseous compounds, for example, into compounds which do not polymerize, or do so less easily, so that a deposit on the coating does not arise or is eliminated. The use of an envelope hermetically sealed from the outer world achieves that no water vapour or other undesirable (possibly aggressive) gases penetrate the device. This prevents degradation of the diode laser, for example, caused by corrosion. This combination of measures gives devices according to the invention particularly stable properties and a very long useful life.

Various compounds may be chosen as the gaseous oxidizing compound, such as ozone or carbon monoxide. Preferably, oxygen is used as the gaseous oxidizing compound. Very good results are obtained therewith, while in addition oxygen is a gas at normal temperature and pressure, so that it can be easily introduced into the device before the latter is hermetically sealed off from the surroundings. This may be done in various ways. Preferably, the device is filled with a dry and clean inert gas, such as dry and clean nitrogen or argon, to which a certain percentage of oxygen is added. Very low oxygen concentrations were found to be suitable for avoiding the problems described, for example, a content of approximately 0.2 vol. %. The desired oxygen content is also partly determined by the quantity of organic material (organic impurities) present inside the device the moment it is sealed of hermetically from the outer world. In those cases where there is a comparatively high degree of pollution with carbon-containing substances, good results are obtained with an oxygen content of approximately 10 vol. %. A content of approximately 20 vol. % oxygen has the additional advantage that dried air divested of other impurities can be used.

It was found that said deposits rich in carbon take place especially when devices are used comprising a diode laser emitting at a radiation wavelength below approximately 1 μm. At emission wavelength above approximately 1 μm, influencing of chemical reactions or organic compounds in the gas phase takes place to a low degree only. Such influencing then takes place through the generation of vibrations in the organic compounds. At a wavelength below approximately 1 μm, the degree of electronic excitation increases. This excitation is usually a maximum for organic compounds in the UV (ultraviolet) portion of the spectrum. However, these excitations also play a part in photochemical reactions in the case of visible radiation. The problems described above and the effectivity of a device according to the invention were especially noted in devices comprising diode lasers of (Al)GaAs/AlGaAs or InGaP/InAlGaP. These diode lasers emit radiation with a wavelength between approximately 0.6 and approximately 0.9 μm.

It is noted that JP-A-60 186 076 discloses a hermetically enveloped infrared-radiating diode laser with an atmosphere containing oxygen in the envelope. This, however, is a laser without a coating impermeable to gases. Oxygen is added with the object of counteracting a reaction between the laser and nitrogen gas. The oxygen forms a protective oxide coating on the mirror of the laser during operation.

Particularly good results were obtained with so-called high-power diode lasers. These are diode lasers whose maximum emitted optical power is at least approximately 10 mW, preferably at least approximately 20 mW. Such high powers are highly desirable for many applications, such as writing on optical discs. The problem counteracted by the invention occurs most strongly in such diodes. This is probably due on the one hand to the comparatively high temperature assumed by the coating at such powers and on the other hand to the high optical flux.

A method of manufacturing devices according to the invention is characterized in that the radiation-emitting semiconductor diode, preferably a diode laser, is placed in an envelope into which a gaseous oxidizing compound is introduced, after which the envelope is hermetically sealed off from the outer world. In a preferred embodiment of a method according to the invention, the diode fastened on a base is brought into a welding or soldering device, the diode fastened on the base is surrounded with an inert gas to which oxygen has been added, and the diode is enveloped and hermetically sealed off from the outer world through welding or soldering of a cover provided with a window onto the base.

BRIEF DESCRIPTION OF THE DRAWING

The invention will now be explained in more detail with reference to two embodiments and the accompanying drawing, in which.

The Figures are diagrammatic and not drawn to scale, the dimensions of the radiation-emitting semiconductor diode being particularly exaggerated for the sake of clarity. Corresponding components have generally been given the same reference numerals in the various Figures.

DESCRIPTION OF THE PREFERRED EMBODIMENTS

Figure 1:
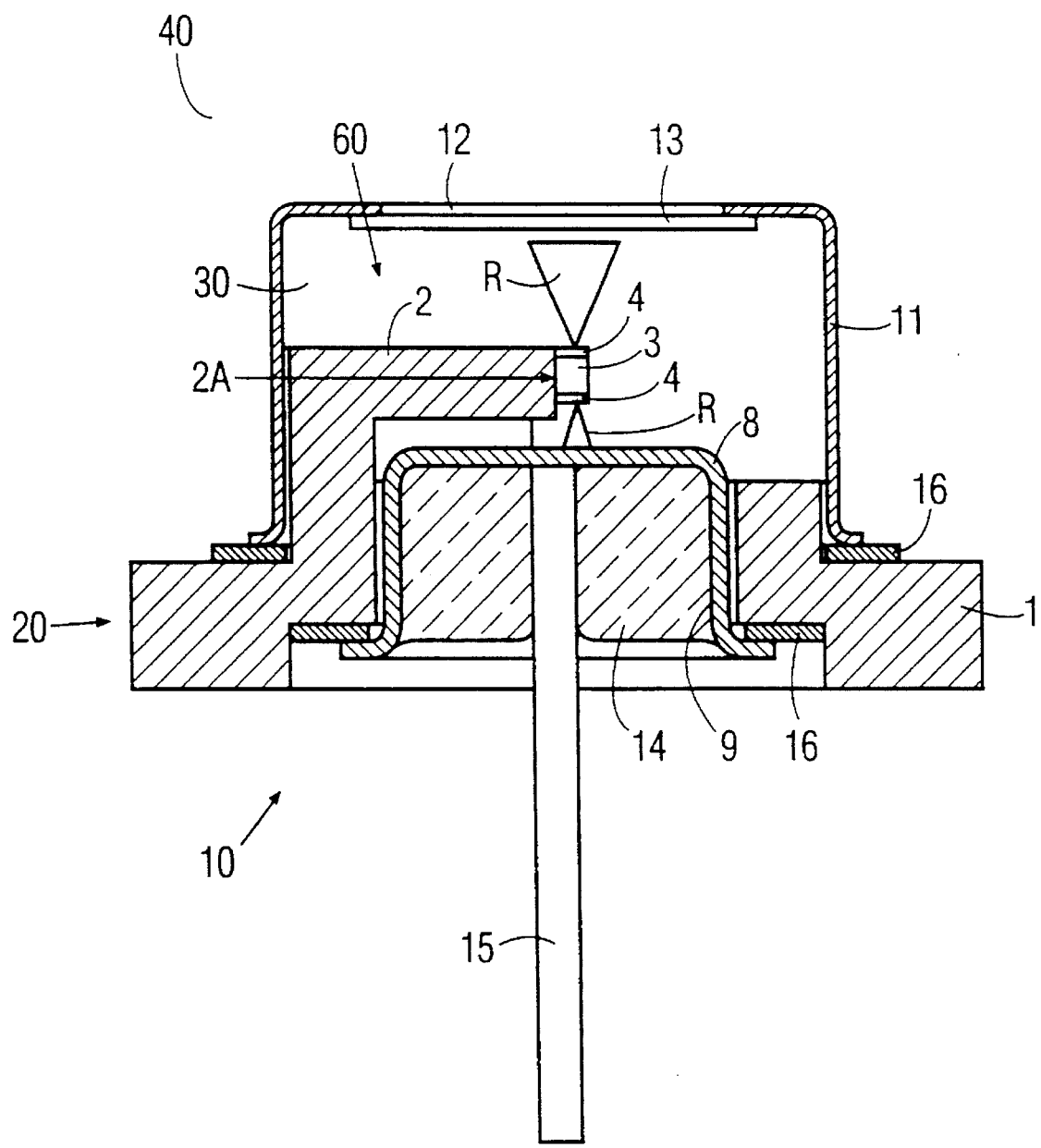
FIG. 1 diagrammatically and in cross-section shows an embodiment of an optoelectronic semiconductor device according to the invention.

FIG. 1 diagrammatically and in cross-section shows an embodiment of an optoelectronic semiconductor device according to the invention. The device 10 comprises an envelope 20 which is built up from a metal mounting block 1, a base 8 with a metal wall 9, and a metal cover 11. The mounting block 1 comprises a sector-shaped carrier portion 2 of which a side face 2A comprises the centreline of the device 10 and on which a radiation-emitting semiconductor diode, here a laser diode 3 is fastened.

The laser diode 3 in this embodiment is an (Al)GaAs/AlGaAs semiconductor diode of the ridge waveguide type which emits a radiation R at a wavelength of approximately 780 nm. An exit surface for the generated radiation R of the diode laser 3, in this case both exit surfaces, is/are provided with a coating 4 which comprises aluminium oxide in this case. Owing to this coating 4, the mirror surfaces of the diode laser 3 are passivated and the diode laser 3 is protected against degradation caused by (chemical) reactions at the mirror surface. The thicknesses of the coatings 4 are so chosen here that the radiation R generated by the diode laser 3 is incident for a small portion in the direction of the wall 9 of the base 8 (thickness of the relevant coating 4 approximately ½ λ) where a photodiode (not shown in the drawing) is present, and issues for the major part from the device 10 through a glass window 13 fastened against an opening 12 in the cover 11 (thickness of the relevant coating 4 approximately ¼ λ). The diode laser 3 is thus particularly suitable for so-called high-power applications, such as the writing of information on an optical registration disc.

The base 8 comprises within the wall 9 a glass-type body 14 in which three conductors 15 are present which lie one behind the other in the cross-section of the drawing. One of these conductors 15 is electrically connected to the wall 9 of the base 8, and accordingly to the laser diode 3 and the photodiode via the mounting block 1, 2. The other conductors 15 are connected to the laser diode 3 and to the photodiode—if present—by means of wire connections (not shown in the drawing).

According to the invention, the radiation-emitting semiconductor diode, here the laser diode 3, is arranged within an envelope 20 which is hermetically sealed off from the outer world 40, while a gaseous oxidizing compound 30, comprising oxygen in this case, is present within the envelope. Thanks to the oxygen 30 present within the envelope 20, the dissociation or polymerization of gaseous organic substances 60 present inside the envelope 20—during operation of the device 20 or otherwise—into non-volatile compounds rich in carbon is counteracted or eliminated. A deposit rich in carbon on the coatings 4 of the diode laser 3 is prevented thereby, so that the laser has a stable optical output. The envelope 20 contains a dry and clean inert gas, nitrogen in this case, with an oxygen content of at least approximately 0.2 vol. %, in this case approximately 10 vol. %. Since the envelope 20 hermetically seals off the diode laser 3 from the outer world 40, according to the invention, it is avoided that the diode laser 3 is degraded by water vapour or other (possibly aggressive) gaseous impurities present in the surroundings 40. The device 10 according to the invention thus has a particularly long useful life, while it is comparatively simple and therefore cheap to manufacture. In the present example, the envelope 20 is hermetically sealed off from the outer world 40 by means of welding rings 16, by which the mounting block 1 is connected to the base 8 and the cover 11. The cover 11 is provided with a window 13 through which part of the generated radiation R issues from the device 10. Between the window 13 and the cover 11 there is an indium ring (not shown in the drawing) which provides a hermetic sealing between the cover 11 and the window 13.

Very favourable results were also obtained with the device 20 according to the invention as described above with a diode laser 3 of the InGaP/InAlGaP material system, emitting at a wavelength of approximately 650 nm. It will be clear from the introductory description of the suitability of radiation of a given wavelength for influencing chemical reactions that a deposit rich in carbon will readily be formed on such a comparatively short-wave diode laser 3, and that the fluctuations resulting therefrom will be comparatively strong. Accordingly, the improvement in the stability of such a diode laser 3 in a device 20 according to the invention will be comparatively great.

Figure 2:
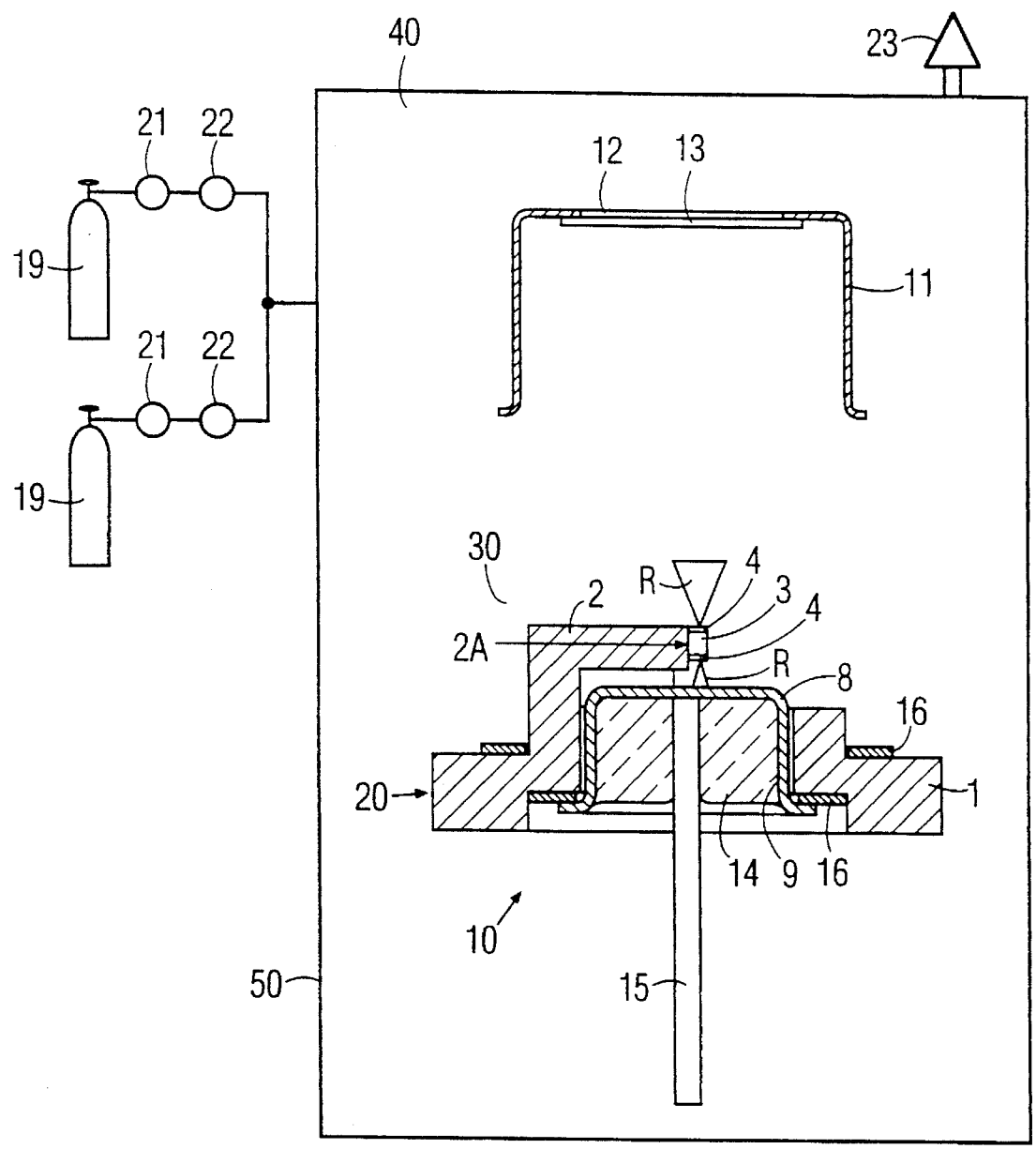
FIG. 2 show the device of FIG. 1 in a stage of manufacture by a method according to the invention.

FIG. 2 shows the device of FIG. 1 in a stage of its manufacture by a method according to the invention. After a base 8 and a mounting block 1 have been welded together so as to form an envelope 20, a diode laser 3 provided with coatings 4 is soldered to the mounting block 1 and connected to the base 8 by means of a wire connection (not shown in the drawing). Then the envelope 20 and a cover 11 provided with a window 13 are brought into a closed space 50, in this case a glove box, within which a welding unit (not shown in the drawing) is arranged. A certain amount of nitrogen per unit time is introduced into the space 50 from a cylinder 19 through filters 21, 22 with which the nitrogen is freed from water vapour and other impurities. Oxygen 30 is supplied from another cylinder 19 in a similar manner at an approximately 10 times lower flowrate into the space 50. The space 50 is provided with an overpressure valve 23. Subsequently the cover 11 is welded to the envelope 20 inside the space 50 so that a device 20 according to the invention is obtained within which the laser diode 3 provided with coatings 4 is present in an atmosphere of clean and dry nitrogen which contains approximately 10 vol % oxygen 30 and which is hermetically sealed off from the surroundings. A very attractive device 20 according to the invention is thus obtained in a simple manner.

The invention is not limited to the embodiment given since many modifications and variations are possible to those skilled in the art within the scope of the invention. Thus the coating may comprise a different material from that in the example. It is also possible for the (laser) diodes to have a structure other than the ridge waveguide structure chosen here, such as a buried heterostructure, oxide stripe structure, etc.

It is further noted that a laser amplifier diode may also be used as the laser diode. Furthermore, the envelope need not have an exit window for the generated radiation, in contrast to the example given. Indeed, the invention can be advantageously applied also when the diode (laser) emits radiation exclusively to other optoelectronic components inside the envelope, or exchanges radiation therewith.

I claim:

1. An optoelectronic semiconductor device (10) comprising a radiation-emitting semiconductor diode (3), said diode (3) having an exit surface for generated radiation (R) with a coating (4) provided on said exit surface, characterized in that the coating (4) is impermeable to gases and the radiation-emitting semiconductor diode (3) is situated within an envelope (20) which is hermetically sealed from the outer world (40) and in that a gaseous oxidizing compound (30) is provided inside the envelope (20).

2. An optoelectronic semiconductor device (10) as claimed in claim 1, characterized in that the gaseous oxidizing compound (30) comprises oxygen (30).

3. An optoelectronic semiconductor device (10) as claimed in claim 2, characterized in that a dry and clean inert gas is present within the envelope (20), to which gas oxygen (30) has been added, and in that the oxygen content of the atmosphere inside the envelope (20) is at least approximately 0.2 vol. %.

4. An optoelectronic semiconductor device (10) as claimed in claim 1, characterized in that the emission wavelength of the radiation-emitting semiconductor diode (3) is below approximately 1 μm.

5. An optoelectronic semiconductor device (10) as claimed in claim 4, characterized in that the emission wavelength of the radiation-emitting semiconductor diode (3) lies between approximately 0.6 and approximately 0.9 μm.

6. An optoelectronic semiconductor device (10) as claimed in claim 1, characterized in that the radiation-emitting semiconductor diode (3) comprises a diode laser (3).

7. An optoelectronic semiconductor device as claimed in claim 6, characterized in that the maximum power emitted by the diode laser (3) is at least approximately 10 mW.

8. An opto-electronic semiconductor device as claimed in claim 5, characterized in that the emission wavelength of the radiation-emitting semiconductor diode (3) lies between approximately 650 and 780 nm.

9. An opto-electronic semiconductor device as claimed in claim 1, characterized in that the radiation-emitting diode (3) comprises a substrate of GaAs, an active layer of AlGaAs and cladding layers of AlGaAs with a higher aluminum content than the active layer.

10. An opto-electronic semiconductor device as claimed in claim 1, characterized in that the radiation-emitting semiconductor diode (3) comprises a substrate of GaAs, an active layer of InGaP or AlInGaP and cladding layers of AlInP or AlGaInP with a higher aluminum content than the active layer.

11. An optoelectronic semiconductor device (10) as claimed in claim 3, wherein said dry and clean inert gas comprises nitrogen.

12. An optoelectronic semiconductor device (10) as claimed in claim 3, wherein said oxygen content is about 10 vol. %.

13. An optoelectronic semiconductor device (10) as claimed in claim 7, wherein said maximum power is at least about 20 mW.

* * * * *